US012719500B2

(12) United States Patent
Kieffer et al.

(10) Patent No.: US 12,719,500 B2
(45) Date of Patent: Aug. 25, 2026

(54) SYSTEM AND METHOD FOR SEARCHING DATA VIA PACKED-DECIMAL CONVERSION WITHIN A STANDALONE MAINFRAME CLIENT

(71) Applicant: BANK OF AMERICA CORPORATION, Charlotte, NC (US)

(72) Inventors: Malinda Kieffer, Chillicothe, MO (US); Naveen Adala, Charlotte, NC (US); Kevin A. Delson, Woodland Hills, CA (US); Kirk A. Hawrysio, Oak Point, TX (US); Anne M. Matrone, Staten Island, NY (US); Noel Arnaldo Medina, Katy, TX (US); Thomas D. Morris, Middleburg, FL (US); Pankaj Nagpal, Charlotte, NC (US); Owen Nelson, Farmingdale, NY (US); Robert R. Rosseland, Jr., Huntersville, NC (US); John David Weber, Lake Saint Louis, MO (US); Tanya A. Wilson, Newark, DE (US)

(73) Assignee: BANK OF AMERICA CORPORATION, Charlotte, NC (US)

( * ) Notice: Subject to any disclaimer, the term of this patent is extended or adjusted under 35 U.S.C. 154(b) by 126 days.

(21) Appl. No.: 18/917,818

(22) Filed: Oct. 16, 2024

(65) Prior Publication Data

US 2026/0106630 A1 Apr. 16, 2026

(51) Int. Cl.
*H03M 7/40* (2006.01)
*G06F 16/335* (2019.01)
*G06F 16/11* (2019.01)
*G06F 16/13* (2019.01)
*G06F 16/182* (2019.01)

(52) U.S. Cl.
CPC ........ *H03M 7/4012* (2013.01); *G06F 16/335* (2019.01); *G06F 16/122* (2019.01); *G06F 16/13* (2019.01); *G06F 16/182* (2019.01)

(58) Field of Classification Search
CPC .. H03M 7/4012; G06F 16/335; G06F 16/122; G06F 16/13; G06F 16/182
See application file for complete search history.

(56) References Cited

U.S. PATENT DOCUMENTS

| | | | |
|---|---|---|---|
| 6,369,725 B1 | 4/2002 | Busaba | |
| 7,657,515 B1 | 2/2010 | Jewell | |
| 8,423,595 B2 | 4/2013 | Lundvall et al. | |
| 9,335,993 B2 | 5/2016 | Carlough et al. | |
| 11,449,564 B2 | 9/2022 | Pidduck et al. | |
| 2020/0125530 A1* | 4/2020 | Barth | G06F 16/13 |

* cited by examiner

*Primary Examiner* — Joseph J Lauture
(74) *Attorney, Agent, or Firm* — Moore & Van Allen PLLC; Nicholas C. Russell

(57) ABSTRACT

Systems, computer program products, and methods are described herein for searching data via packed-decimal conversion within a standalone mainframe client. The present disclosure is configured to receive a term within a standalone mainframe client, where the standalone mainframe client comprises a dataset; convert the received term into a packed-decimal format; search the dataset for matches with the converted term in packed-decimal format; and return a set of matches within the dataset of the standalone mainframe client for the received term.

20 Claims, 5 Drawing Sheets

SYSTEM AND METHOD FOR SEARCHING DATA VIA PACKED-DECIMAL CONVERSION WITHIN A STANDALONE MAINFRAME CLIENT

TECHNOLOGICAL FIELD

Example embodiments of the present disclosure relate to searching data via packed-decimal conversion within a standalone mainframe client.

BACKGROUND

Searching a dataset or mainframe may have traditionally been performed by searching for an actual integer equivalent within mass amounts of data. Searches conducted may be time intensive and prone to errors due to manual entry of data in an unfamiliar format.

Applicant has identified a number of deficiencies and problems associated with searching data via packed-decimal conversion within a standalone mainframe client. Through applied effort, ingenuity, and innovation, many of these identified problems have been solved by developing solutions that are included in embodiments of the present disclosure, many examples of which are described in detail herein.

BRIEF SUMMARY

Systems, methods, and computer program products are provided for searching data via packed-decimal conversion within a standalone mainframe client. In one aspect, a system for searching data via packed-decimal conversion within a standalone mainframe client is presented. The system including a processing device, at least one non-transitory storage device, and at least one processing device coupled to the at least one non-transitory storage device wherein the at least one processing device may be configured to: receive a term within a standalone mainframe client, wherein the standalone mainframe client comprises a dataset; convert the received term into a packed-decimal format; search the dataset for matches with the converted term in packed-decimal format; and return a set of matches within the dataset of the standalone mainframe client for the received term.

In some embodiments, the term comprises a sign, wherein the sign indicates a positive or negative value associated with the term.

In some embodiments, the term comprises at least one term.

In some embodiments, the set of matches are filtered by frequency and location within the dataset.

In some embodiments, the at least one processing device is further configured to return a set of locations within the dataset corresponding to the set of matches.

In some embodiments, the at least one processing device is further configured to generate a report comprising the set of matches within the dataset.

In some embodiments, converting the term into packed-decimal format further comprises conversion of the term into an equivalent packed-decimal format value.

In another aspect, a computer program product for searching data via packed-decimal conversion within a standalone mainframe client is presented. The computer program product comprising at least one non-transitory computer-readable medium having computer-readable program code portions embodied therein, the computer-readable program code portions which when executed by a processing device are configured to cause the processor to perform the following operations: receive a term within a standalone mainframe client, wherein the standalone mainframe client comprises a dataset; convert the received term into a packed-decimal format; search the dataset for matches with the converted term in packed-decimal format; and return a set of matches within the dataset of the standalone mainframe client for the received term.

In some embodiments, the term comprises a sign, wherein the sign indicates a positive or negative value associated with the term.

In some embodiments, the term comprises at least one term.

In some embodiments, the set of matches are filtered by frequency and location within the dataset.

In some embodiments, the processor further performs the following operation to return a set of locations within the dataset corresponding to the set of matches.

In some embodiments, the processor further performs the following operation to generate a report comprising the set of matches within the dataset.

In some embodiments, converting the term into packed-decimal format further comprises conversion of the term into an equivalent packed-decimal format value.

In another aspect, a computer-implemented method for searching data via packed-decimal conversion within a standalone mainframe client is presented. The computer-implemented method may include receiving a term within a standalone mainframe client, wherein the standalone mainframe client comprises a dataset; converting the received term into a packed-decimal format; searching the dataset for matches with the converted term in packed-decimal format; and returning a set of matches within the dataset of the standalone mainframe client for the received term.

In some embodiments, the term comprises a sign, wherein the sign indicates a positive or negative value associated with the term.

In some embodiments, the term comprises at least one term.

In some embodiments, the set of matches are filtered by frequency and location within the dataset.

In some embodiments, the computer-implemented method further includes returning a set of locations within the dataset corresponding to the set of matches.

In some embodiments, the computer-implemented method further includes generating a report comprising the set of matches within the dataset.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having thus described embodiments of the disclosure in general terms, reference will now be made the accompanying drawings. The components illustrated in the figures may or may not be present in certain embodiments described herein. Some embodiments may include fewer (or more) components than those shown in the figures.

Figure 1A:
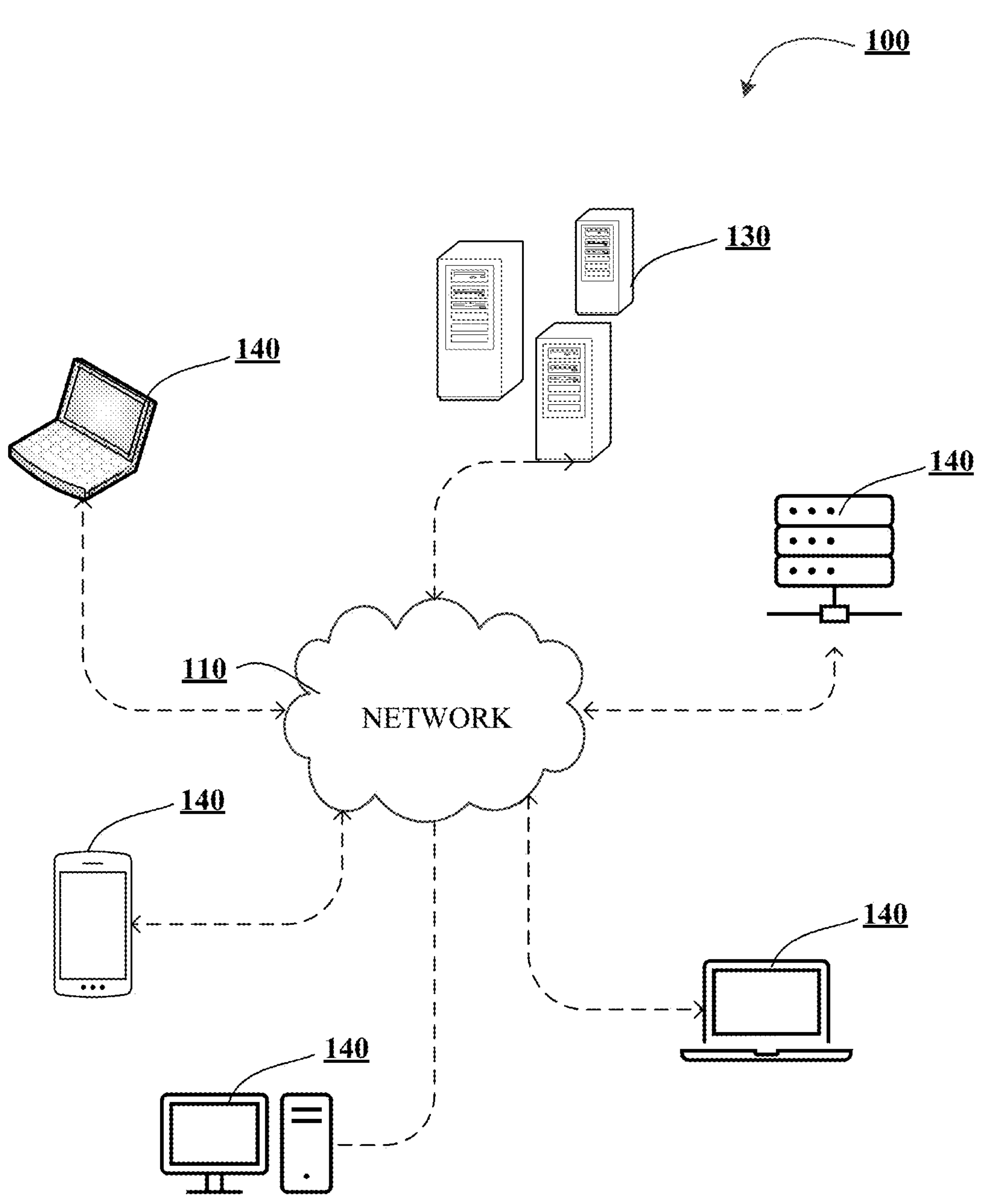
Figure 1B:
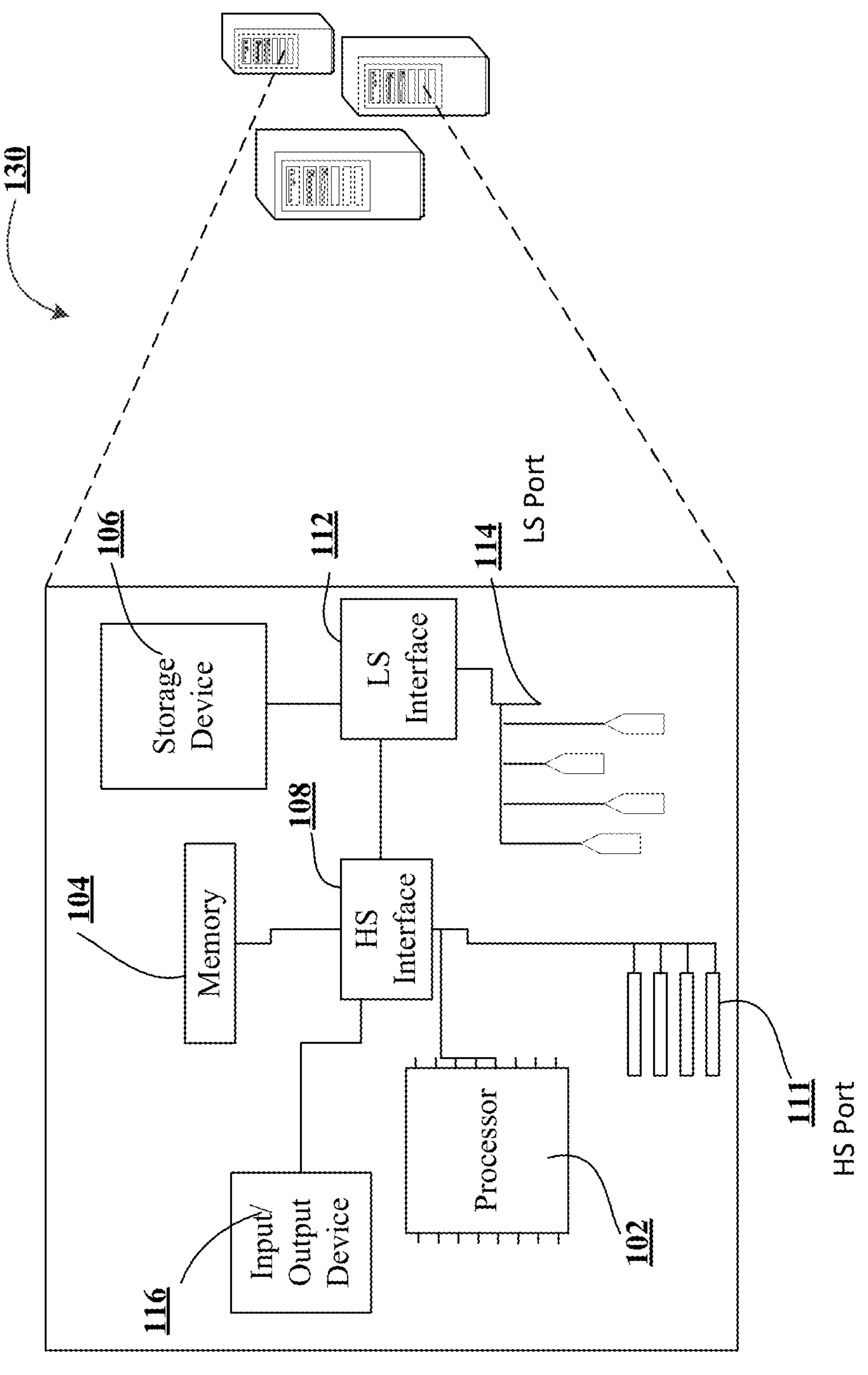
Figure 1C:
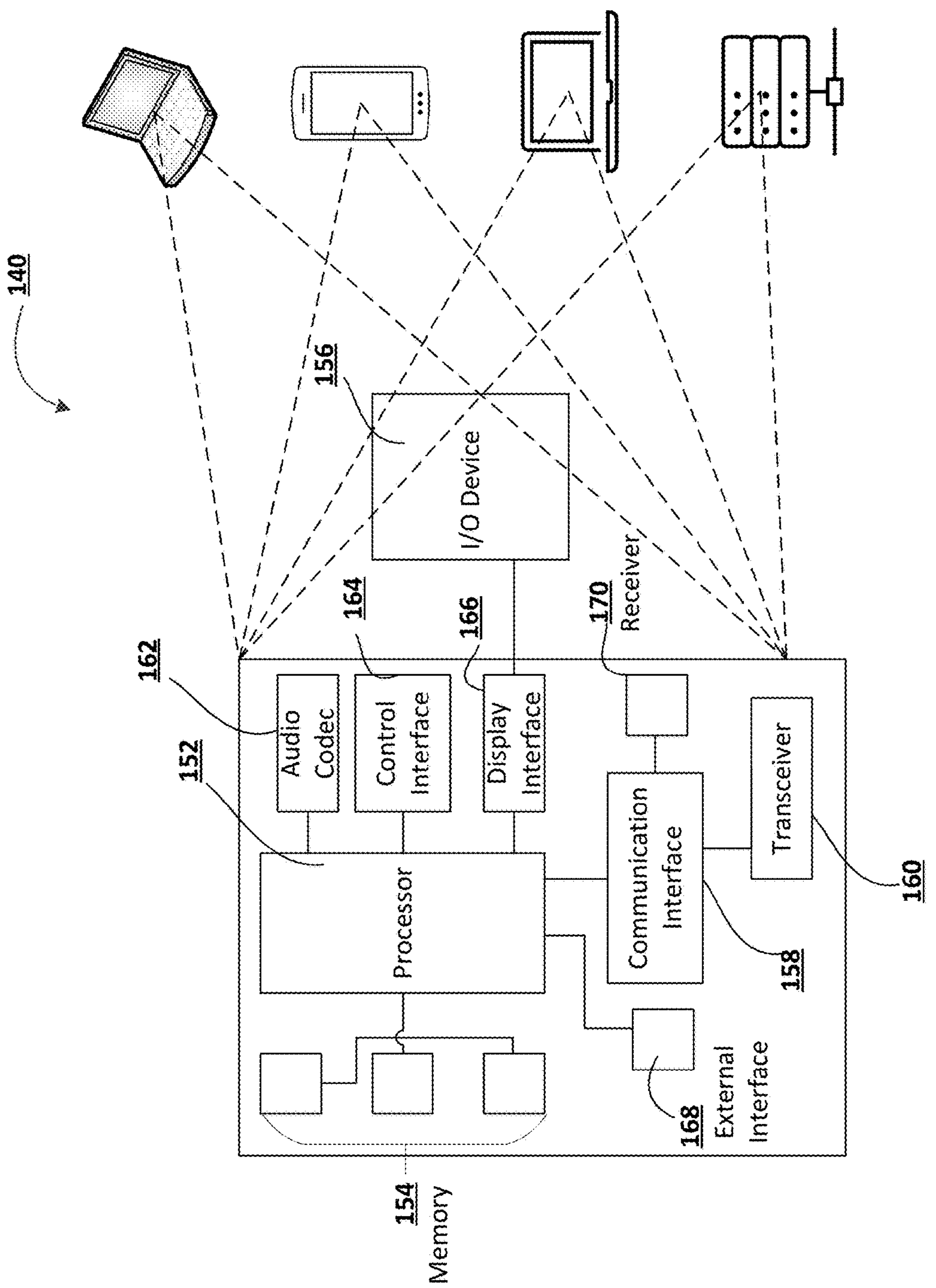
Figure 2:
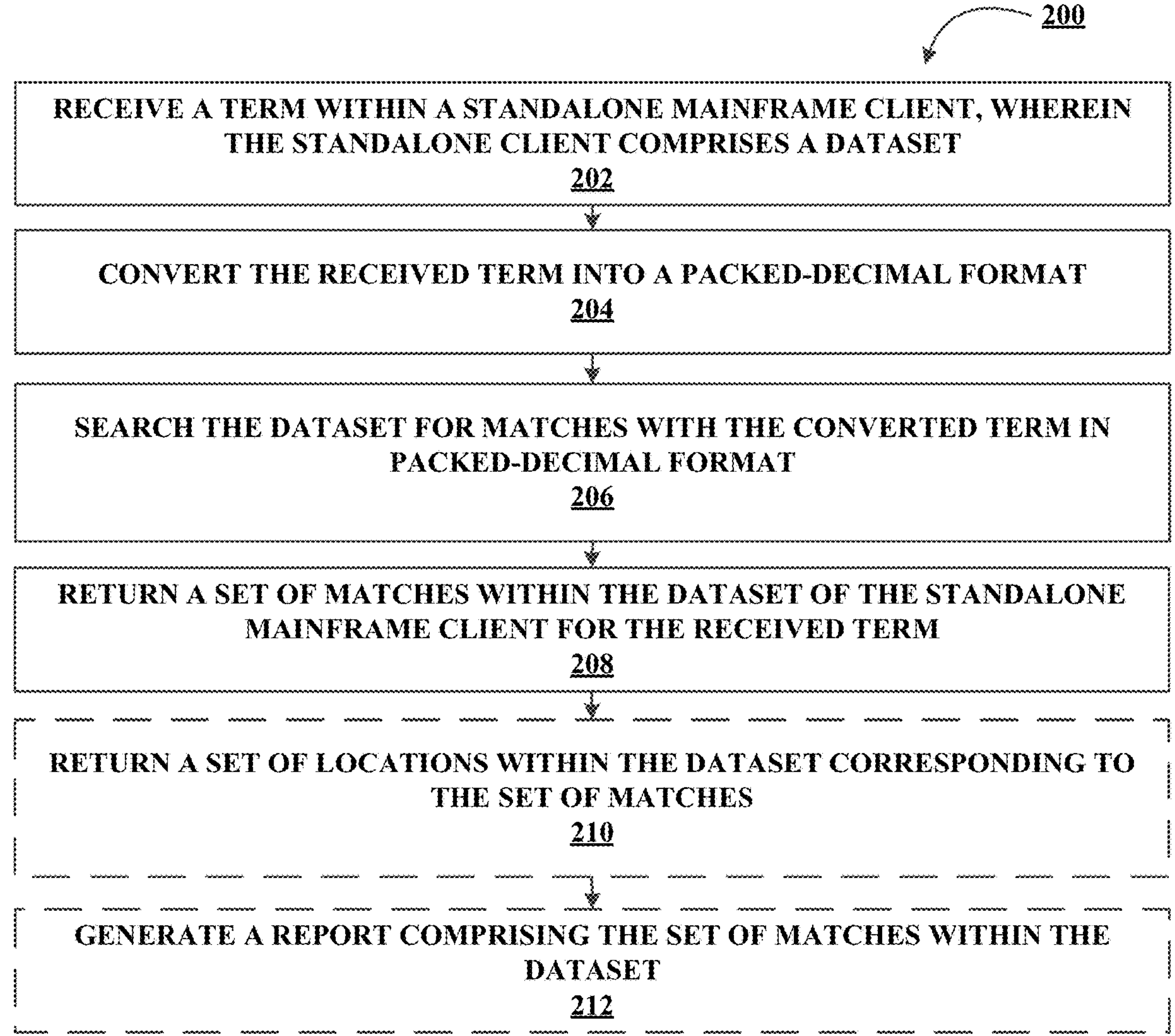
Figure 3:
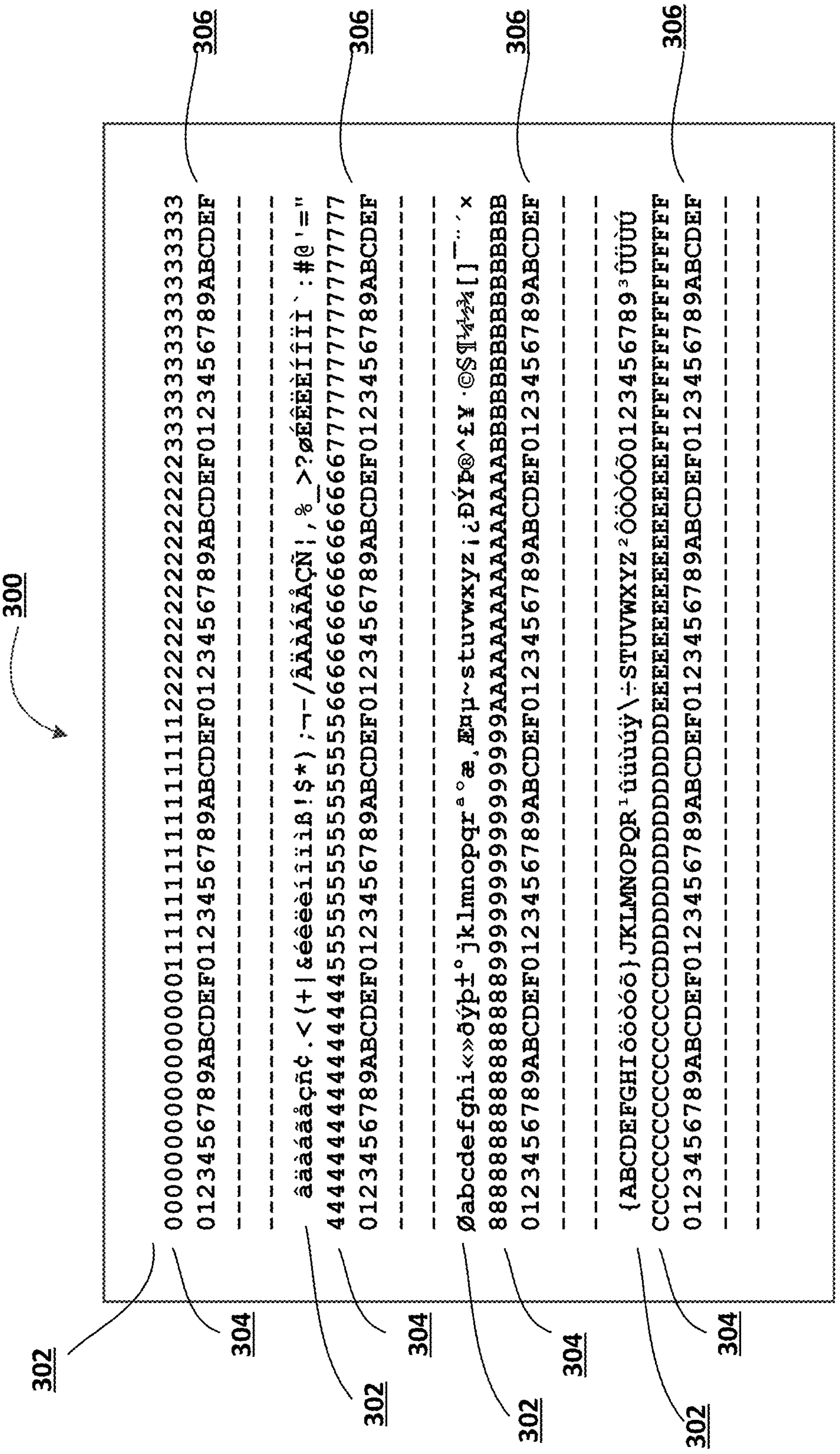

FIGS. 1A-1C illustrates technical components of an exemplary distributed computing environment for searching data via packed-decimal conversion within a standalone mainframe client, in accordance with an embodiment of the disclosure;

FIG. 2 illustrates a process flow for searching data via packed-decimal conversion within a standalone mainframe client, in accordance with an embodiment of the disclosure; and FIG. 3 illustrates an exemplary extended binary coded decimal interchange code (EBCDIC) character set chart, in accordance with an embodiment of the disclosure.

DETAILED DESCRIPTION

Embodiments of the present disclosure will now be described more fully hereinafter with reference to the accompanying drawings, in which some, but not all, embodiments of the disclosure are shown. Indeed, the disclosure may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on." Like numbers refer to like elements throughout.

As used herein, an "entity" may be any institution employing information technology resources and particularly technology infrastructure configured for processing large amounts of data. Typically, these data can be related to the people who work for the organization, its products or services, the customers or any other aspect of the operations of the organization. As such, the entity may be any institution, group, association, financial institution, establishment, company, union, authority or the like, employing information technology resources for processing large amounts of data.

As described herein, a "user" may be an individual associated with an entity. As such, in some embodiments, the user may be an individual having past relationships, current relationships or potential future relationships with an entity. In some embodiments, the user may be an employee (e.g., an associate, a project manager, an IT specialist, a manager, an administrator, an internal operations analyst, or the like) of the entity or enterprises affiliated with the entity.

As used herein, a "user interface" may be a point of human-computer interaction and communication in a device that allows a user to input information, such as commands or data, into a device, or that allows the device to output information to the user. For example, the user interface includes a graphical user interface (GUI) or an interface to input computer-executable instructions that direct a processor to carry out specific functions. The user interface typically employs certain input and output devices such as a display, mouse, keyboard, button, touchpad, touch screen, microphone, speaker, LED, light, joystick, switch, buzzer, bell, and/or other user input/output device for communicating with one or more users.

As used herein, "authentication credentials" may be any information that can be used to identify of a user. For example, a system may prompt a user to enter authentication information such as a username, a password, a personal identification number (PIN), a passcode, biometric information (e.g., iris recognition, retina scans, fingerprints, finger veins, palm veins, palm prints, digital bone anatomy/structure and positioning (distal phalanges, intermediate phalanges, proximal phalanges, and the like), an answer to a security question, a unique intrinsic user activity, such as making a predefined motion with a user device. This authentication information may be used to authenticate the identity of the user (e.g., determine that the authentication information is associated with the account) and determine that the user has authority to access an account or system. In some embodiments, the system may be owned or operated by an entity. In such embodiments, the entity may employ additional computer systems, such as authentication servers, to validate and certify resources inputted by the plurality of users within the system. The system may further use its authentication servers to certify the identity of users of the system, such that other users may verify the identity of the certified users. In some embodiments, the entity may certify the identity of the users. Furthermore, authentication information or permission may be assigned to or required from a user, application, computing node, computing cluster, or the like to access stored data within at least a portion of the system.

It should also be understood that "operatively coupled," as used herein, means that the components may be formed integrally with each other, or may be formed separately and coupled together. Furthermore, "operatively coupled" means that the components may be formed directly to each other, or to each other with one or more components located between the components that are operatively coupled together. Furthermore, "operatively coupled" may mean that the components are detachable from each other, or that they are permanently coupled together. Furthermore, operatively coupled components may mean that the components retain at least some freedom of movement in one or more directions or may be rotated about an axis (i.e., rotationally coupled, pivotally coupled). Furthermore, "operatively coupled" may mean that components may be electronically connected and/or in fluid communication with one another.

As used herein, an "interaction" may refer to any communication between one or more users, one or more entities or institutions, one or more devices, nodes, clusters, or systems within the distributed computing environment described herein. For example, an interaction may refer to a transfer of data between devices, an accessing of stored data by one or more nodes of a computing cluster, a transmission of a requested task, or the like.

It should be understood that the word "exemplary" is used herein to mean "serving as an example, instance, or illustration." Any implementation described herein as "exemplary" is not necessarily to be construed as advantageous over other implementations.

As used herein, "determining" may encompass a variety of actions. For example, "determining" may include calculating, computing, processing, deriving, investigating, ascertaining, and/or the like. Furthermore, "determining" may also include receiving (e.g., receiving information), accessing (e.g., accessing data in a memory), and/or the like. Also, "determining" may include resolving, selecting, choosing, calculating, establishing, and/or the like. Determining may also include ascertaining that a parameter matches a predetermined criterion, including that a threshold has been met, passed, exceeded, and so on.

Searching and organizing large amounts of data within a mainframe may be a time and relatively resource consuming activity. Matching data within the mainframe with received data or a "term" enables a user or entity to identify requested information and locate the position of the requested information within the dataset. Searching through the dataset may prove difficult in some instances due to the size and complexity of the dataset.

Large amounts of data may be time consuming and difficult to search through. Manually specifying the data term may further be subject to errors, as typos and misspellings may occur if the data or term is provided in different formats. Locating the term/data searched in a user-friendly and readable format may also vastly improve the search efficiency and ability to find the targeted data. Combined, these problems of manual typing errors, identifying location, and slow searching speeds may prevent users and entities from accessing data within the mainframe when requested.

Searching data via packed-decimal conversion within a standalone mainframe client may enable a user to search data directly. Additionally, packed-decimal conversion may enable quick searching while being easily convertible to a user-friendly format and extracted into a report. Multiple terms may be searched within the dataset, and the provided search may reduce errors encountered from manual entry of a term in packed-decimal form.

Accordingly, the present disclosure describes searching data via packed-decimal conversion within a standalone mainframe client. A term may be received within a standalone mainframe client (e.g., a central data repository or hub within an entity's data processing center) that may be searched within a dataset of the standalone mainframe client. The received term may be converted from an original form (e.g., an integer or string) and converted into a packed-decimal format (and in some embodiments an equivalent packed-decimal format value) for efficient and less processing power intensive search. After conversion of the received term into a packed-decimal format, the dataset may be searched for matches with the converted term. The set of matches found within the dataset may then be returned, as well as the locations and number of matches for the received term. The received term may comprise a plurality of terms (e.g., multiple different searches may be conducted at once). A sign may further be added to the received term to indicate a positive or negative value. The returned set of matches may further be filtered by frequency and location within the dataset in some embodiments. Additionally, a report of the set of matches and frequency of the set of matches may be provided in some embodiments.

What is more, the present disclosure provides a technical solution to a technical problem. As described herein, the technical problem includes efficiently searching data within a standalone mainframe client. The technical solution presented herein allows for searching data via packed-decimal conversion within a standalone mainframe client. In particular, searching data via packed-decimal conversion within a standalone mainframe client is an improvement over existing solutions to the searching data within a standalone mainframe client, (i) with fewer steps to achieve the solution, thus reducing the amount of computing resources, such as processing resources, storage resources, network resources, and/or the like, that are being used, (ii) providing a more accurate solution to problem, thus reducing the number of resources required to remedy any errors made due to a less accurate solution, (iii) removing manual input and waste from the implementation of the solution, thus improving speed and efficiency of the process and conserving computing resources, (iv) determining an optimal amount of resources that need to be used to implement the solution, thus reducing network traffic and load on existing computing resources. Furthermore, the technical solution described herein uses a rigorous, computerized process to perform specific tasks and/or activities that were not previously performed. In specific implementations, the technical solution bypasses a series of steps previously implemented, thus further conserving computing resources.

FIGS. 1A-1C illustrate technical components of an exemplary distributed computing environment for searching data via packed-decimal conversion within a standalone mainframe client 100, in accordance with an embodiment of the disclosure. As shown in FIG. 1A, the distributed computing environment 100 contemplated herein may include a system 130, an end-point device(s) 140, and a network 110 over which the system 130 and end-point device(s) 140 communicate therebetween. FIG. 1A illustrates only one example of an embodiment of the distributed computing environment 100, and it will be appreciated that in other embodiments one or more of the systems, devices, and/or servers may be combined into a single system, device, or server, or be made up of multiple systems, devices, or servers. Also, the distributed computing environment 100 may include multiple systems, same or similar to system 130, with each system providing portions of the necessary operations (e.g., as a server bank, a group of blade servers, or a multi-processor system).

In some embodiments, the system 130 and the end-point device(s) 140 may have a client-server relationship in which the end-point device(s) 140 are remote devices that request and receive service from a centralized server, i.e., the system 130. In some other embodiments, the system 130 and the end-point device(s) 140 may have a peer-to-peer relationship in which the system 130 and the end-point device(s) 140 are considered equal and all have the same abilities to use the resources available on the network 110. Instead of having a central server (e.g., system 130) which would act as the shared drive, each device that is connect to the network 110 would act as the server for the files stored on it.

The system 130 may represent various forms of servers, such as web servers, database servers, file server, or the like, various forms of digital computing devices, such as laptops, desktops, video recorders, audio/video players, radios, workstations, or the like, or any other auxiliary network devices, such as wearable devices, Internet-of-things devices, electronic kiosk devices, entertainment consoles, mainframes, or the like, or any combination of the aforementioned.

The end-point device(s) 140 may represent various forms of electronic devices, including user input devices such as personal digital assistants, cellular telephones, smartphones, laptops, desktops, and/or the like, merchant input devices such as point-of-sale (POS) devices, electronic payment kiosks, and/or the like, electronic telecommunications device (e.g., automated teller machine (ATM)), and/or edge devices such as routers, routing switches, integrated access devices (IAD), and/or the like.

The network 110 may be a distributed network that is spread over different networks. This provides a single data communication network, which can be managed jointly or separately by each network. Besides shared communication within the network, the distributed network often also supports distributed processing. The network 110 may be a form of digital communication network such as a telecommunication network, a local area network ("LAN"), a wide area network ("WAN"), a global area network ("GAN"), the Internet, or any combination of the foregoing. The network 110 may be secure and/or unsecure and may also include wireless and/or wired and/or optical interconnection technology.

It is to be understood that the structure of the distributed computing environment and its components, connections and relationships, and their functions, are meant to be exemplary only, and are not meant to limit implementations of the disclosures described and/or claimed in this document. In one example, the distributed computing environment 100 may include more, fewer, or different components. In another example, some or all of the portions of the distributed computing environment 100 may be combined into a single portion or all of the portions of the system 130 may be separated into two or more distinct portions.

FIG. 1B illustrates an exemplary component-level structure of the system 130, in accordance with an embodiment of the disclosure. As shown in FIG. 1B, the system 130 may include a processor 102, memory 104, input/output (I/O) device 116, and a storage device 110. The system 130 may also include a high-speed interface 108 connecting to the memory 104, and a low-speed interface 112 connecting to low speed bus 114 and storage device 110. Each of the components 102, 104, 108, 110, and 112 may be operatively coupled to one another using various buses and may be mounted on a common motherboard or in other manners as appropriate. As described herein, the processor 102 may include a number of subsystems to execute the portions of processes described herein. Each subsystem may be a self-contained component of a larger system (e.g., system 130) and capable of being configured to execute specialized processes as part of the larger system.

The processor 102 can process instructions, such as instructions of an application that may perform the functions disclosed herein. These instructions may be stored in the memory 104 (e.g., non-transitory storage device) or on the storage device 110, for execution within the system 130 using any subsystems described herein. It is to be understood that the system 130 may use, as appropriate, multiple processors, along with multiple memories, and/or I/O devices, to execute the processes described herein.

The memory 104 stores information within the system 130. In one implementation, the memory 104 is a volatile memory unit or units, such as volatile random access memory (RAM) having a cache area for the temporary storage of information, such as a command, a current operating state of the distributed computing environment 100, an intended operating state of the distributed computing environment 100, instructions related to various methods and/or functionalities described herein, and/or the like. In another implementation, the memory 104 is a non-volatile memory unit or units. The memory 104 may also be another form of computer-readable medium, such as a magnetic or optical disk, which may be embedded and/or may be removable. The non-volatile memory may additionally or alternatively include an EEPROM, flash memory, and/or the like for storage of information such as instructions and/or data that may be read during execution of computer instructions. The memory 104 may store, recall, receive, transmit, and/or access various files and/or information used by the system 130 during operation.

The storage device 106 is capable of providing mass storage for the system 130. In one aspect, the storage device 106 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier may be a non-transitory computer- or machine-readable storage medium, such as the memory 104, the storage device 104, or memory on processor 102.

The high-speed interface 108 manages bandwidth-intensive operations for the system 130, while the low speed controller 112 manages lower bandwidth-intensive operations. Such allocation of functions is exemplary only. In some embodiments, the high-speed interface 108 is coupled to memory 104, input/output (I/O) device 116 (e.g., through a graphics processor or accelerator), and to high-speed expansion ports 111, which may accept various expansion cards (not shown). In such an implementation, low-speed controller 112 is coupled to storage device 106 and low-speed expansion port 114. The low-speed expansion port 114, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The system 130 may be implemented in a number of different forms. For example, the system 130 may be implemented as a standard server, or multiple times in a group of such servers. Additionally, the system 130 may also be implemented as part of a rack server system or a personal computer such as a laptop computer. Alternatively, components from system 130 may be combined with one or more other same or similar systems and an entire system 130 may be made up of multiple computing devices communicating with each other.

FIG. 1C illustrates an exemplary component-level structure of the end-point device(s) 140, in accordance with an embodiment of the disclosure. As shown in FIG. 1C, the end-point device(s) 140 includes a processor 152, memory 154, an input/output device such as a display 156, a communication interface 158, and a transceiver 160, among other components. The end-point device(s) 140 may also be provided with a storage device, such as a microdrive or other device, to provide additional storage. Each of the components 152, 154, 158, and 160, are interconnected using various buses, and several of the components may be mounted on a common motherboard or in other manners as appropriate.

The processor 152 is configured to execute instructions within the end-point device(s) 140, including instructions stored in the memory 154, which in one embodiment includes the instructions of an application that may perform the functions disclosed herein, including certain logic, data processing, and data storing functions. The processor may be implemented as a chipset of chips that include separate and multiple analog and digital processors. The processor may be configured to provide, for example, for coordination of the other components of the end-point device(s) 140, such as control of user interfaces, applications run by end-point device(s) 140, and wireless communication by end-point device(s) 140.

The processor 152 may be configured to communicate with the user through control interface 164 and display interface 166 coupled to a display 156. The display 156 may be, for example, a TFT LCD (Thin-Film-Transistor Liquid Crystal Display) or an OLED (Organic Light Emitting Diode) display, or other appropriate display technology. The display interface 156 may comprise appropriate circuitry and configured for driving the display 156 to present graphical and other information to a user. The control interface 164 may receive commands from a user and convert them for submission to the processor 152. In addition, an external interface 168 may be provided in communication with processor 152, so as to enable near area communication of end-point device(s) 140 with other devices. External interface 168 may provide, for example, for wired communication in some implementations, or for wireless communication in other implementations, and multiple interfaces may also be used.

The memory 154 stores information within the end-point device(s) 140. The memory 154 can be implemented as one or more of a computer-readable medium or media, a volatile memory unit or units, or a non-volatile memory unit or units. Expansion memory may also be provided and connected to end-point device(s) 140 through an expansion interface (not shown), which may include, for example, a SIMM (Single In Line Memory Module) card interface. Such expansion memory may provide extra storage space for end-point device(s) 140 or may also store applications or other information therein. In some embodiments, expansion memory may include instructions to carry out or supplement the processes described above and may include secure information also. For example, expansion memory may be provided as a security module for end-point device(s) 140 and may be programmed with instructions that permit secure use of end-point device(s) 140. In addition, secure applications may be provided via the SIMM cards, along with additional information, such as placing identifying information on the SIMM card in a non-hackable manner.

The memory 154 may include, for example, flash memory and/or NVRAM memory. In one aspect, a computer program product is tangibly embodied in an information carrier. The computer program product contains instructions that, when executed, perform one or more methods, such as those described herein. The information carrier is a computer- or machine-readable medium, such as the memory 154, expansion memory, memory on processor 152, or a propagated signal that may be received, for example, over transceiver 160 or external interface 168.

In some embodiments, the user may use the end-point device(s) 140 to transmit and/or receive information or commands to and from the system 130 via the network 110. Any communication between the system 130 and the end-point device(s) 140 may be subject to an authentication protocol allowing the system 130 to maintain security by permitting only authenticated users (or processes) to access the protected resources of the system 130, which may include servers, databases, applications, and/or any of the components described herein. To this end, the system 130 may trigger an authentication subsystem that may require the user (or process) to provide authentication credentials to determine whether the user (or process) is eligible to access the protected resources. Once the authentication credentials are validated and the user (or process) is authenticated, the authentication subsystem may provide the user (or process) with permissioned access to the protected resources. Similarly, the end-point device(s) 140 may provide the system 130 (or other client devices) permissioned access to the protected resources of the end-point device(s) 140, which may include a GPS device, an image capturing component (e.g., camera), a microphone, and/or a speaker.

The end-point device(s) 140 may communicate with the system 130 through communication interface 158, which may include digital signal processing circuitry where necessary. Communication interface 158 may provide for communications under various modes or protocols, such as the Internet Protocol (IP) suite (commonly known as TCP/IP). Protocols in the IP suite define end-to-end data handling methods for everything from packetizing, addressing and routing, to receiving. Broken down into layers, the IP suite includes the link layer, containing communication methods for data that remains within a single network segment (link); the Internet layer, providing internetworking between independent networks; the transport layer, handling host-to-host communication; and the application layer, providing process-to-process data exchange for applications. Each layer contains a stack of protocols used for communications. In addition, the communication interface 158 may provide for communications under various telecommunications standards (2G, 3G, 4G, 5G, and/or the like) using their respective layered protocol stacks. These communications may occur through a transceiver 160, such as radio-frequency transceiver. In addition, short-range communication may occur, such as using a Bluetooth, Wi-Fi, or other such transceiver (not shown). In addition, GPS (Global Positioning System) receiver module 170 may provide additional navigation- and location-related wireless data to end-point device(s) 140, which may be used as appropriate by applications running thereon, and in some embodiments, one or more applications operating on the system 130.

The end-point device(s) 140 may also communicate audibly using audio codec 162, which may receive spoken information from a user and convert the spoken information to usable digital information. Audio codec 162 may likewise generate audible sound for a user, such as through a speaker, e.g., in a handset of end-point device(s) 140. Such sound may include sound from voice telephone calls, may include recorded sound (e.g., voice messages, music files, etc.) and may also include sound generated by one or more applications operating on the end-point device(s) 140, and in some embodiments, one or more applications operating on the system 130.

Various implementations of the distributed computing environment 100, including the system 130 and end-point device(s) 140, and techniques described here can be realized in digital electronic circuitry, integrated circuitry, specially designed ASICs (application specific integrated circuits), computer hardware, firmware, software, and/or combinations thereof.

FIG. 2 illustrates a process flow for systems and methods for searching data via packed-decimal conversion within a standalone mainframe client. In some embodiments, a system (e.g., similar to one or more of the systems described herein with respect to FIGS. 1A-1C) may perform one or more of the steps of process flow 200.

As shown in Block 202, the process flow 200 may include the step of receiving a term within a standalone mainframe client. The received term may be presented in data formats including but not limited to characters, binary, floating point, zoned decimal, packed decimal, and integer forms. The received term may comprise data that may be searched within the standalone mainframe client, as described in greater detail below. Searching the standalone mainframe client may be conducted to highlight, search, replace, note, spot, and/or identify terms and locations within the standalone mainframe matching the received term. The received term may conform to a predetermined length. For instance, the received term may have a minimum length of one character and a maximum length of 17 characters. Characters within the received term may be analyzed and converted into packed-decimal format, as described in greater detail below.

A mainframe may be a central data repository or hub within an entity. The mainframe may be linked to an end point device(s) as previously described in FIGS. 1A-1C. Data stored within the mainframe may be stored in a binary format using extended binary coded decimal interchange code (EBCDIC) encoding, which may comprise a set of 256 eight-bit characters as described in greater detail in FIG. 3. The standalone mainframe client may refer to software applications or hardware devices that directly interact with a mainframe without needing a host environment or intermediary. The client may run independently and connect to a mainframe to perform functions including but not limited to data retrieval, processing, communicating, and/or managing operations on the mainframe.

In some embodiments, the packed-decimal format may be implemented via signed zoned-decimal data. In signed zoned-decimal data formats, the tail end or last byte/character may denote the sign of the received term. For instance, "Dn" may be used to denote a negative term while "Fn" may be used to denote a positive term wherein "n" in both cases may be any term or number. A character may be designated to use for a positive sign or negative sign. For instance, the characters "C", "A", "F", or "E" may indicate a positive term while the characters "D" or "B" may be used to indicate a negative term. In another example, the number "0008188049755" may be a provided term that may be indicated as positive. When converted into a packed-decimal format, the term may be divided into two parts (e.g., Part A using "81880" and Part B using "49755C", wherein "C" indicates the term is positive). Part A and Part B may be converted into a packed decimal form and searched within the mainframe standalone client. In some embodiments, the leading zeros of the received term may be ignored, removed, or isolated from the search (e.g., "0008188049755" may be searched as "8188049755"). In some embodiments, the received term may be represented in a hexadecimal representation (e.g., a received term designated as negative "123456789" in singed zoned-decimal format may be represented as "012345678R"). In some embodiments, plain characters within the received term may not undergo conversion and stay as provided.

In some embodiments, the received term may comprise a plurality of terms or at least one term. For instance, the received term may comprise a first term (e.g., term A) and a second term (e.g., term B). The first term and the second term may be converted into packed-decimal format and subsequently searched for within the standalone mainframe client. For instance, the set of matches with term A may be returned with the locations of the set of matches for term A while the set of matches with term B may be separately returned with the location of the set of matches for term B. The number of matches for a single term within the plurality may not be equal for each term (e.g., term A may return a set of 10 matches while term B may return a set of 2 matches), as described in greater detail below.

In some embodiments, the set of matches with the received term within the standalone mainframe client may not be found. If the set of matches with the received term within the standalone mainframe client are not located or returned, a notification may be transmitted indicating the lack of matches. For instance, if the term "238165" is not found within the standalone mainframe client, a notification may be transmitted to a predetermined source indicating the lack of matches. In some embodiments wherein the received term comprises a plurality of terms, the set of matches may comprise matches for a portion of the plurality of terms and a notification for terms within the plurality without a match. For instance, if the received term comprises term A and term B, but the set of matches comprises matches with term A, the returned set of matches will return the matching term A locations and transmit the notification that no matches were found corresponding to term B. In some embodiments, the number of separate terms within the received term may be 40 separate terms. For instance, the terms "101", "872", and "0123456789" may be individual terms within the received term.

Packed-decimal format may enable compact searching capabilities within the standalone mainframe client. A character within a term converted into packed-decimal format may represent 4 bits or 1 nibble and may be a more efficient mechanism to search the mainframe standalone client than when the term is presented in the decimal representation of the same value. The packed-decimal format may be mapped to a binary format which may be a faster and more efficient format to search within the mainframe standalone client. For instance, an integer may be converted into packed-decimal format which may align with binary architecture/formats within the standalone mainframe client. The ability of packed-decimal formats to closely map to binary data may increase the efficiency and storage space utilized for searching terms within the standalone mainframe client.

As shown in Block 204, the process flow 200 may include the step of converting the received term into a packed-decimal format. Conversion of the received term may comprise calculation of the packed-decimal format equivalent of the received term. For instance, the received term may be converted from the original form of an integer (e.g., the received term of "40075393632") with the sign of the received term provided. The received term may then be split into two terms, with term A ("400753") and term B ("93632C"). Term A and term B may then be converted into a packed-decimal field, wherein the 4 bit pair of the entire 8 bit (1 character) may store 16 different values, with the last character pair having the trailing sign (e.g., "C" to indicate a positive term). The received term may then be converted into a hexadecimal format. The received term may be padded with zeros duly appended with the desired sign at the lower 4 bits of the last character to conform the target signed packed-decimal field size. For instance, the received term of "670194230" may be designated as a positive term, and a concatenation of "00" may be paired with the received term to fully accommodate the target signed packed-decimal field size. Term A and term B may then be converted into the packed-decimal format, as outlined in greater detail within FIG. 3.

As shown in Block 206, the process flow 200 may include the step of searching the dataset for matches with the converted term in packed-decimal format. Searching the dataset within the standalone mainframe client for matches with the converted term may be conducted through comparison of the converted term in packed-decimal format to terms within the dataset. For instance, if term A is found in record Y at position Z, the record and position may be added to a set of matches associated with term A. Comparison of the converted received term with terms within the dataset may be conducted within the entirety of the dataset or a predetermined portion of the dataset.

As shown in Block 208, the process flow 200 may include the step of returning a set of matches within the dataset of the standalone mainframe client for the received term. The set of matches within the dataset associated with each term may be returned, including the location and number of matches with each term. For instance, the total number of matches with term A may be returned, as well as the total number of matches with term B. Additionally the location of the set of matches with the received term may be returned in some embodiments, as described in greater detail below. Returning the set of matches may comprise presenting, indicating, and/or transmitting a notification to a predetermined location of the set of matches associated with the received term. For instance, a notification may be transmitted back to the source of the received term indicating that term A was found within records X, Y, and Z. In some embodiments, the position of the match within each record may be transmitted (e.g., the first match of term A within record X was found at position 35).

In some embodiments as shown in Block 210, the process flow 200 may include the step of returning a set of locations within the dataset corresponding to the set of matches. The set of locations may correspond with the set of matches returned/found within the dataset of the standalone mainframe client. Further, locations associated with the set of matches returned may be identified within a generated report indicating the number of matches and locations of the set of matches, as described in greater detail below. The set of locations may indicate the position of the set of matches within the dataset and may be filtered by location and frequency of matches. For instance, a portion of the set of matches corresponding with term A may be filtered to show matches within one segment, portion, file, and/or part of the dataset. In another instance, a portion of the set of matches corresponding with term A and term B may be filtered to show matches above a predetermined threshold (e.g., returned results may be filtered to show terms that appear at least an X number of times within the dataset).

In some embodiments as shown in Block 212, the process flow 200 may include the step of generating a report including the set of matches within the dataset. The report including the set of matches within the dataset may comprise an accessible summary of the returned matches that may be "viewer friendly". The report may further include the set of locations within the dataset corresponding to the set of matches. The report may be based on the number of received terms, the set of matches, and/or the set of locations within the dataset corresponding to the set of matches. For instance, the generated report may indicate portions of the received term that were found to match entries within the dataset, the frequency of the matches, and the location within the dataset.

FIG. 3 illustrates an exemplary EBCDIC character set chart 300. In some embodiments, a system (e.g., similar to one or more of the systems described herein with respect to FIGS. 1A-1C and FIG. 2) may utilize a form of the EBCDIC character set chart as exemplified in FIG. 3. The exemplary EBCDIC character set chart may be utilized for conversions of characters within a term to hexadecimal representation/format, which may occur during conversion of the received term into packed-decimal format.

As shown in the exemplary EBCDIC character set chart 300, a character 302 may be indexed by the EBCDIC row 304 and the EBCDIC column 306. A character 302 may be referenced by the EBCDIC row 304 and the EBCDIC column 306. For instance, the character 302 when embodied as "J" may have a EBCDIC row 304 of "D" and a EBCDIC column 306 of "1", thus the character "J" may be described as x'D1', wherein x'##' denotes hexadecimal format/notation. In the EBCDIC character set chart 300 described, x'00' may be the lowest value while x'FF' may be the highest value in the provided format. The characters 302 ranging from x'00' to x'3F' may not comprise a printable character and may instead represent commands, signals, control characters, basic punctuation, and/or processing procedures (e.g., x'00' may signal the end of a line of text). A character within the received term may comprise an 8 bit hexadecimal representation of all available EBCDIC characters, a combination of an upper 4 bit and a lower 4 bit wherein metadata for an EBCDIC file stored within the mainframe may define the structure and layout of data records.

As will be appreciated by one of ordinary skill in the art, the present disclosure may be embodied as an apparatus (including, for example, a system, a machine, a device, a computer program product, and/or the like), as a method (including, for example, a business process, a computer-implemented process, and/or the like), as a computer program product (including firmware, resident software, micro-code, and the like), or as any combination of the foregoing. Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of the disclosures herein. In addition, the method described above may include fewer steps in some cases, while in other cases may include additional steps. Modifications to the steps of the method described above, in some cases, may be performed in any order and in any combination.

It will be understood that any suitable computer-readable medium may be utilized. The computer-readable medium may include, but is not limited to, a non-transitory computer-readable medium, such as a tangible electronic, magnetic, optical, infrared, electromagnetic, and/or semiconductor system, apparatus, and/or device. For example, in some embodiments, the non-transitory computer-readable medium includes a tangible medium such as a portable computer diskette, a hard disk, a random access memory (RAM), a read-only memory (ROM), an erasable programmable read-only memory (EPROM or Flash memory), a compact disc read-only memory (CD-ROM), and/or some other tangible optical and/or magnetic storage device. In other embodiments of the present invention, however, the computer-readable medium may be transitory, such as a propagation signal including computer-executable program code portions embodied therein.

It will also be understood that one or more computer-executable program code portions for carrying out the specialized operations of the present invention may be required on the specialized computer include object-oriented, scripted, and/or unscripted programming languages, such as, for example, Java, Perl, Smalltalk, C++, SAS, SQL, Python, Objective C, and/or the like. In some embodiments, the one or more computer-executable program code portions for carrying out operations of embodiments of the present invention are written in conventional procedural programming languages, such as the "C" programming languages and/or similar programming languages. The computer program code may alternatively or additionally be written in one or more multi-paradigm programming languages, such as, for example, F#.

It will further be understood that some embodiments of the present invention are described herein with reference to flowchart illustrations and/or block diagrams of systems, methods, and/or computer program products. It will be understood that each block included in the flowchart illustrations and/or block diagrams, and combinations of blocks included in the flowchart illustrations and/or block diagrams, may be implemented by one or more computer-executable program code portions. These computer-executable program code portions execute via the processor of the computer and/or other programmable data processing apparatus and create mechanisms for implementing the steps and/or functions represented by the flowchart(s) and/or block diagram block(s).

It will also be understood that the one or more computer-executable program code portions may be stored in a transitory or non-transitory computer-readable medium (e.g., a memory, and the like) that can direct a computer and/or other programmable data processing apparatus to function in a particular manner, such that the computer-executable program code portions stored in the computer-readable medium produce an article of manufacture, including instruction mechanisms which implement the steps and/or functions specified in the flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable apparatus provide operational steps to implement the steps specified in the flowchart(s) and/or the functions specified in the block diagram block(s). Alternatively, computer-implemented steps may be combined with operator and/or human-implemented steps in order to carry out an embodiment of the present invention.

Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system for searching data via packed-decimal conversion within a standalone mainframe client, the system comprising:

a processing device;

at least one non-transitory storage device; and at least one processing device coupled to the at least one non-transitory storage device, wherein the at least one processing device is configured to:

receive a term within a standalone mainframe client, wherein the standalone mainframe client comprises a dataset;

convert the received term into a packed-decimal format;

search the dataset for matches with the converted term in packed-decimal format; and return a set of matches within the dataset of the standalone mainframe client for the received term.

2. The system of claim 1, wherein the term comprises a sign, wherein the sign indicates a positive or negative value associated with the term.

3. The system of claim 2, wherein the term comprises at least one term.

4. The system of claim 1, wherein the set of matches are filtered by frequency and location within the dataset.

5. The system of claim 1, the at least one processing device is further configured to return a set of locations within the dataset corresponding to the set of matches.

6. The system of claim 5, wherein the at least one processing device is configured to generate a report comprising the set of matches within the dataset.

7. The system of claim 1, wherein converting the term into packed-decimal format further comprises conversion of the term into a signed packed-decimal format value.

8. A computer program product for searching data via packed-decimal conversion within a standalone mainframe client, the computer program product comprising at least one non-transitory computer-readable medium having computer-readable program code portions embodied therein, the computer-readable program code portions which when executed by a processing device are configured to cause a processor to perform the following operations:

receive a term within a standalone mainframe client, wherein the standalone mainframe client comprises a dataset;

convert the received term into a packed-decimal format;

search the dataset for matches with the converted term in packed-decimal format; and return a set of matches within the dataset of the standalone mainframe client for the received term.

9. The computer program product of claim 8, wherein the term comprises a sign, wherein the sign indicates a positive or negative value associated with the term.

10. The computer program product of claim 9, wherein the term comprises at least one term.

11. The computer program product of claim 8, wherein the set of matches are filtered by frequency and locations within the dataset.

12. The computer program product of claim 8, wherein the processor further performs the following operation of: return a set of locations within the dataset corresponding to the set of matches.

13. The computer program product of claim 12, wherein the processor further performs the following operation of: generate a report comprising the set of matches within the dataset.

14. The computer program product of claim 8, wherein converting the term into packed-decimal format further comprises conversion of the term into a signed packed-decimal format value.

15. A computer-implemented method for searching data via packed-decimal conversion within a standalone mainframe client, the computer-implemented method comprising:

receiving a term within a standalone mainframe client, wherein the standalone mainframe client comprises a dataset;

converting the received term into a packed-decimal format;

searching the dataset for matches with the converted term in packed-decimal format; and returning a set of matches within the dataset of the standalone mainframe client for the received term.

16. The computer-implemented method of claim 15, wherein the term comprises a sign, wherein the sign indicates a positive or negative value associated with the term.

17. The computer-implemented method of claim 16, the term comprises at least one term.

18. The computer-implemented method of claim 15, wherein the set of matches are filtered by frequency and location within the dataset.

19. The computer-implemented method of claim 15, wherein the computer-implemented method further comprises: returning a set of locations within the dataset corresponding to the set of matches.

20. The computer-implemented method of claim 19, wherein the computer-implemented method further comprises: generating a report comprising the set of matches within the dataset.

* * * * *